United States Patent [19]
Hemmie et al.

[11] Patent Number: 5,523,768
[45] Date of Patent: Jun. 4, 1996

[54] INTEGRATED FEED AND DOWN CONVERTER APPARATUS

[75] Inventors: Dale L. Hemmie; Douglas Mills, both of Burlington, Iowa

[73] Assignee: Conifer Corporation, Burlington, Iowa

[21] Appl. No.: 170,520

[22] Filed: Dec. 20, 1993

Related U.S. Application Data

[63] Continuation-in-part of Ser. No. 4,968, Jan. 5, 1993, Pat. No. 5,300,941, which is a continuation of Ser. No. 707,918, May 30, 1991, Pat. No. 5,202,699.

[51] Int. Cl.⁶ .............................. H01Q 19/13; H01Q 9/20
[52] U.S. Cl. ................. 343/840; 343/795; 343/700 MS; 455/293
[58] Field of Search ..................... 343/840, 795, 343/878, 880, 881, 882, 883, 786, 820, 822, 821, 700 MS; 455/333, 280, 288, 293; H01Q 19/13, 9/20

[56] References Cited

U.S. PATENT DOCUMENTS

| | | | |
|---|---|---|---|
| 3,162,858 | 12/1964 | Cutler | 343/753 |
| 4,290,068 | 9/1981 | Bogner | 343/702 |
| 4,295,143 | 10/1981 | Winegard et al. | 343/840 |
| 4,513,293 | 4/1985 | Stephens | 343/840 |
| 4,595,890 | 6/1986 | Cloutier | 333/103 |
| 4,791,717 | 12/1988 | Hemmie | 29/600 |
| 4,811,031 | 3/1989 | Maile et al. | 343/840 |
| 4,896,163 | 1/1990 | Shibata et al. | 343/786 |
| 5,008,956 | 4/1991 | Hemmie | 455/318 |
| 5,019,833 | 5/1991 | Nonaka | 343/840 |
| 5,020,149 | 5/1991 | Hemmie | 455/325 |
| 5,125,109 | 6/1992 | Geller et al. | 343/700 MS |
| 5,202,699 | 4/1993 | Hemmie et al. | 343/840 |
| 5,300,941 | 4/1994 | Hemmie et al. | 343/840 |
| 5,313,220 | 5/1994 | Hemmie et al. | 343/840 |

FOREIGN PATENT DOCUMENTS

| | | | |
|---|---|---|---|
| 1149931 | 7/1983 | Canada. | |
| 0076642 | 6/1981 | Japan | 343/781 R |
| 0238130 | 10/1986 | Japan | 455/293 |

*Primary Examiner*—Donald Hajec
*Assistant Examiner*—Hoanganh Le
*Attorney, Agent, or Firm*—Zarley, McKee, Thomte, Voorhees & Sease

[57] ABSTRACT

An integrated semi-parabolic antenna/down converter MMDS receiving system wherein the support boom of a semi-parabolic antenna contains the down converter electronics. Located at the focal area of the semi-parabolic antenna are a pair of driven feed elements which are directly connected to the printed circuit board carrying the down converter electronics. The down converter is formed in an elongated shape to fit entirely within the formed hollow interior of the support boom. The down converter comprises a first printed circuit board which contains an RF filter located at the input end of the printed circuit board. The input of the RF filter circuit is directly connected to the pair of driven feed elements by soldering the legs of the driven feed elements directly to the input of the RF filter stage on the first printed circuit board. The RF filter is surrounded by an input ground shield which covers the RF filter circuit. The shield is soldered to the top and bottom ground planes of the printed circuit board. At the opposite end of the printed circuit board is an output amplifier whose output is connected to a coax output lead. A coax ground shield engages the opposite end of the first printed circuit board in a perpendicular orientation so as to position the opposite end of the printed circuit board within the hollow interior.

7 Claims, 11 Drawing Sheets

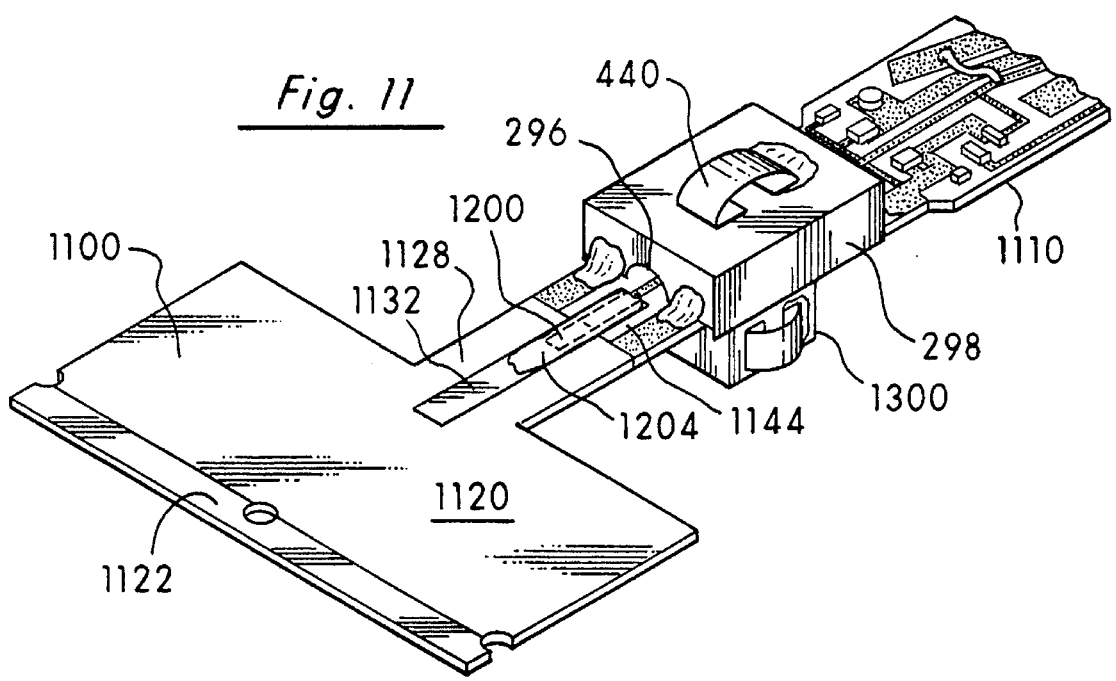

INTEGRATED FEED AND DOWN CONVERTER APPARATUS

RELATED INVENTIONS

This is a continuation-in-part of Ser. No. 08/004968 filed Jan. 5, 1993, now U.S. Pat. No. 5,300,941 which is a continuation of Ser. No. 07/707918, filed May 30, 1991, now U.S. Pat. No. 5,202,699.

BACKGROUND OF THE INVENTION

1. Field of the Invention

This invention relates to down converters for semi-parabolic antennas for use in microwave systems such as multichannel multipoint distribution systems (MMDS) (also termed "wireless cable") and, in particular, to integrating the feed with the down converter into an integrated structure.

2. Statement of the Problem

Wireless cable is competing with cable to offer programming to the public. Wireless cable utilizes a semi-parabolic reflector that is mounted on the rooftop of a consumer's house. Multiple channels are delivered to this semi-parabolic reflector from a remote location. Conventional microwave semiparabolic antenna systems utilize an antenna with a separate down converter mounted on the backside with coaxial cable and connectors interconnecting the two elements.

A need exists to integrate the separate down converter into the semi-parabolic reflector in order to reduce wind load of the overall antenna and down converter receiving system, to provide a system that can be installed by the consumer with a minimum of installation time, to eliminate the need for a separate down converter housing (thus reducing the material and labor costs of the system), to eliminate the coaxial cable and connectors interconnecting the antenna and the down converter in order to reduce the signal loss between the antenna and the down converter (thereby improving the overall system signal-to-noise ratio at a significantly lower materials cost), and to improve the impedance matching between the antenna and the down converter, which allows for an optimum signal transfer.

A further need exists to provide a rigid mechanical and electrical connection between the feed and the down converter printed circuit boards without using an intervening cable or the like. This need exists because of the environmental stresses such as vibration from wind and expansion from wide temperature swings.

3. Results of a Patentability Search

A patentability search was conducted on the teachings of the present invention with respect to a solution to the above problem. The following patents were uncovered in this search:

| U.S. Pat. No. | Inventor | Issue Date |
| --- | --- | --- |
| 3,162,858 | Cutler | 12-22-64 |
| 4,290,068 | Bogner | 9-15-81 |
| 1,149,931 | Thomas (Canada) | 7-12-83 |

The 1964 patent to Cutler sets forth a ring focus antenna feed for a parabolic dish antenna. Cutler discloses a feed connected to a circular waveguide which in turn is connected to an amplifier. The amplifier and the circular waveguide are contained within a supporting pedestal. The amplifier is then interconnected through a second circular waveguide to the transceiver. The second circular waveguide and the transceiver are located behind the parabolic dish. The amplifier and the first circular waveguide are located in the pedestal that supports the feed.

The 1981 patent to Bogner sets forth a multipoint distribution system (MDS) disk-on-rod-type antenna. To the rear of the spaced-apart disk is located a waveguide that includes a cylindrical container having a closed back and sidewalls with an open mouth. Bogner incorporates the down converter into the waveguide in order to reduce wind load and to reduce transmission loss. In implementing the down converter into the waveguide, Bogner requires that it must be contained in less than fifty percent of the volume of the waveguide cavity. Bogner houses his down converter in a separate metal structure within the waveguide. Because the down converter is located in a waveguide, the waveguide must have precise dimensions based on the walvelength of the signal being sensed. Bogner requires that the metal structure containing the down converter electronics must not touch the sidewalls of the waveguide since to do so would change the waveguide and wavelength. The Bogner approach is critically designed for a frequency of 2153 MHz.

The 1983 Canadian patent to Thomas also relates to an MDS antenna suitable for receiving a single microwave transmission in the 2.15-gigahertz range. Thomas utilizes a semi-parabolic antenna having its feed supported by a hollow tubular support in which Thomas integrates the down converter or a portion of the down converter. Thomas connects the feed elements through a matching network to a coaxial cable that interconnects the matching network to a mixer located within the tubular support. The mixer carries the input RF signal from the feed elements to a signal from the local oscillator, and the difference of the input signal (2154.75 MHz) and the local oscillator frequency (2216.0 MHz) is delivered into a set of IF amplifiers whose output is connected to a standard coax cable. The circuit board carrying the electronics contained within the tubular support is grounded to the tubular support by means of an arcuate metal conductor. The conductor electrically connects the printed overlay of the board with the inside metallic surfaces of the support arm. The outer sheath of the coaxial cable that interconnects the mixer with the matching network is also connected to the copper overlay of the circuit board. Likewise, the outer sheath of the coaxial cable interconnecting the outputs of the IF amplifiers and the customer's television set is also grounded to the copper overlay.

Of the three patents found in the search, only the Thomas patent is pertinent. The Bogner approach utilizes a critically designed waveguide having disposed within the waveguide the down converter electronics. The package for the down converter electronics is critically designed and is electrically insulated from the waveguide. Cutler places the amplifier within the feed support but requires a waveguide to extend the signal from the feed to the amplifier. Thomas, like the present invention, utilizes a semi-parabolic antenna and places the down converter or a portion thereof into the tubular support arm that supports the feed. Thomas, while solving the problem with respect to minimizing wind load and reducing the number of separate parts and components, does not provide a system for providing MMDS programming. Hence, a need still exists when implementing the down converter into the tubular support arm to provide RF filtering in order to minimize IF and image type interference, to provide circuit shielding to prevent unwanted signals from radiating past input filtering, to provide multiple grounding connections between the circuit board and the inside of the support boom to maintain the integrity of RF filtering and shielding, to utilize an RF amplifier stage to establish low noise performance, to provide broad band mixing performance with high signal handling characteristics, to reference a stabilized oscillator, and to provide an integrated down converter/antenna system that is compatible with encryption/addressable systems. The Thomas approach was only concerned with processing a single microwave TV channel and was not concerned with the interference potential of other channels in an MMDS configuration. Furthermore, Thomas did not fully eliminate the coaxial cable interconnections.

4. Solution to the Problem

The present invention provides a solution to the above stated problem, a solution that is not met by the above three patents.

The integrated antenna/down converter of the present invention provides a one-piece concept to MDS receive antennas. By integrating all the necessary components in the antenna, installation times are kept to a minimum and there is a reduction in inventory parts used by the MMDS operator. The integrated antenna/down converter unit of the present invention can be packaged for consumer installation to allow for more cost savings by the system operator. All necessary cables and connectors are provided for consumer installation. The semi-parabolic reflector of the present invention mounts the down converter in the feed support boom.

The integrated antenna/down converter of the present invention also provides significant RF filtering so as to minimize IF and image type interference. This is accomplished by providing circuit shielding at the input from the feed that prevents signals from radiating past the input filtering and at the output. Multiple grounding connections exist between the circuit board and the inside of the support boom at the input and output ends. Furthermore, an RF amplifier stage is provided to obtain low noise performance. Broad band mixing performance with high signal handling characteristics are also provided. The circuit of the present invention utilizes a stabilized reference oscillator physically isolated from the main portion of the electronics which also minimizes signal interference. The integrated down converter/antenna system of the present invention is compatible with encryption/addressable systems. Finally, the circuit of the present invention fully eliminates all coaxial cable interconnections between the down converter and the driven feed elements and provides mechanical structural reinforcement between the feed and the down converter printed circuit board and when the feed is mounted on a printed circuit board. Solid electrical connection between the output of the feed and the input of the down converter is also provided.

SUMMARY OF THE INVENTION

An integrated semi-parabolic antenna/down converter MMDS receiving system is disclosed wherein the support boom of a semi-parabolic antenna contains the down converter electronics. Located at the focal area of the semi-parabolic antenna are a pair of driven feed elements that are directly connected to the printed circuit board carrying the down converter electronics, thereby eliminating a costly coax connection. The support boom of the present invention is square in cross-sectional shape and has a formed hollow interior. The down converter of the present invention is formed in an elongated shape to fit entirely within the formed hollow interior of the support boom.

The down converter comprises a first printed circuit board that contains an RF filter located at the input end of the printed circuit board. The input of the RF filter circuit is directly connected to the pair of driven feed elements by soldering the legs of the driven feed elements directly to the input of the RF filter stage on the first printed circuit board. The RF filter is surrounded by an input ground shield that covers the RF filter circuit. The shield is soldered to the top and bottom ground planes of the printed circuit board. A plurality of ground clips are located on the ground shield so as to firmly abut against the interior sides of the support boom in order to establish an electrical ground connection and to position the printed circuit board within the hollow interior of the support boom. In addition, a ground clip is connected to the bottom ground plane in the area of the RF ground shield that cooperates with the aforementioned ground clips. At the opposite end of the printed circuit board is an output amplifier whose output is connected to a coax output lead. A coax ground shield engages the opposite end of the first printed circuit board in a perpendicular orientation so as to position the opposite end of the printed circuit board within the hollow interior. The coax ground shield is connected to the coax ground and to the top and bottom ground planes of the printed circuit board and functions to minimize interfering radiation. A plurality of ground clips are mounted onto the coax ground shield so as to establish an electrical ground connection to the interior of the support boom and to position the opposite end of the down converter centrally within the hollow interior.

The reference oscillator for the down converter is mounted on a second printed circuit board that is spaced from the first printed circuit board and is oriented to have its bottom ground plane facing the bottom ground plane of the first printed circuit board. This arrangement substantially minimizes interference between the reference oscillator and the remaining down converter electronics.

Finally, when the feed is formed on a printed circuit board additional mechanical structural support is provided so as to firmly attach the feed printed circuit board to the down converter printed circuit board.

DESCRIPTION OF THE DRAWING

FIG. 11 is a perspective view of a printed circuit feed (in a first embodiment) directly connected to the down converter.

FIG. 12 is an exploded view of the components shown in FIG. 11.

SPECIFICATION

1. Overview

Figure 1:
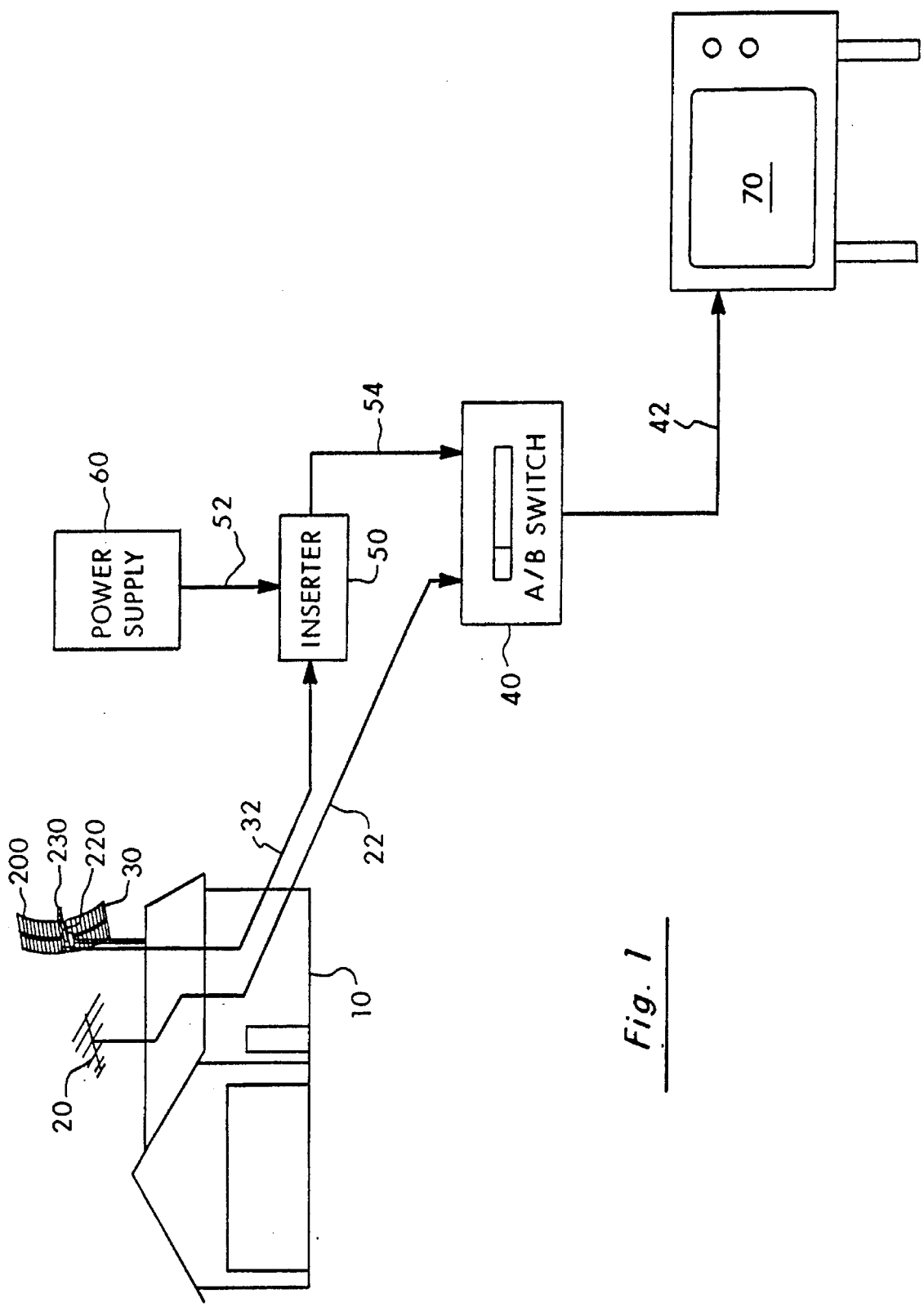
FIG. 1 is an illustration showing the integrated antenna/down converter of the present invention interconnected with a consumer's television system.

In FIG. 1, the environment in which the integrated antenna/down converter of the present invention is utilized is shown. On a consumer's house 10 is mounted a normal antenna 20 and a semi-parabolic MMDS integrated antenna/down converter 30 of the present invention. The conventional antenna 20 is interconnected by means of coaxial cable 22 into a conventional A/B switch 40. The integrated antenna/down converter 30 is also interconnected over coaxial cable 32 to a power inserter 50 that inserts power over lines 52 from a power supply 60. The power inserter 50 is connected by means of coaxial cable 54 to the A/B switch 40. The power inserter 50 is conventional and provides power over coax 32 for powering the down converter portion of the integrated antenna/down converter 30. The A/B switch 40 conventionally selects between the programming available from antenna 20 or from the multiple channels on coax 54 from the MMDS antenna 30. The A/B switch is connected by means of a jumper cable 42 to a consumer's television 70. The system configuration of FIG. 1 is conventional and is shown to simply illustrate the environment in which the integrated antenna/down converter of the present invention operates. Furthermore, it illustrates how power is conventionally supplied over coax 32 to the integrated antenna/down converter 30 of the present invention.

Figure 2:
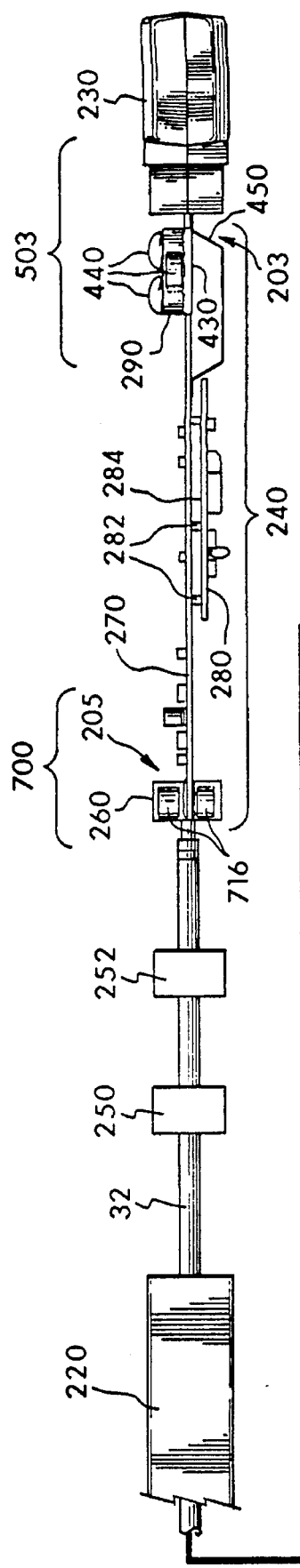
FIG. 2 is an illustration of the various components of the present invention.

In FIG. 2, the integration of the antenna with the down converter of the present invention is shown. A conventional semi-parabolic antenna 200 is mounted to a support post 210. Connected to the antenna 200 is a support boom 220 which, in the preferred embodiment, is a one-inch-square boom. Any suitable size and suitable geometrical cross-sectional shape (such as rectangular, hexagonal, octagonal, or circular) could also be used. The boom 220 supports a feed housing 230 located in the focal point 202 of the antenna 200. Under the teachings of the present invention, the down converter 240 is located on the interior of the support boom 220. A pair of weatherproof seals 250 and 252 are located in the end 222 of the boom 220 nearest the antenna 200. The down converter 240 is located within the hollow interior of the support boom 220 and the feed 230 is mounted on the end 224 farthest from the antenna 200.

The down converter 240 includes the coax bracket 260, an oscillator board 270 having an input end 203 and an output end 205, a daughter board 280, and a front end filter shield 290. While the present invention integrates the down converter into the hollow interior of the support boom of a semi-parabolic antenna, it is to be expressly understood that the teachings of the present invention find application in full parabolic dish antennas or any suitable microwave antenna. Therefore, the shape of the antenna 200 is not a limiting factor to the teachings contained herein.

2. Down Converter Overview

What follows is a brief description of the electronic components used in the down converter 240 of the present invention.

Figure 3:
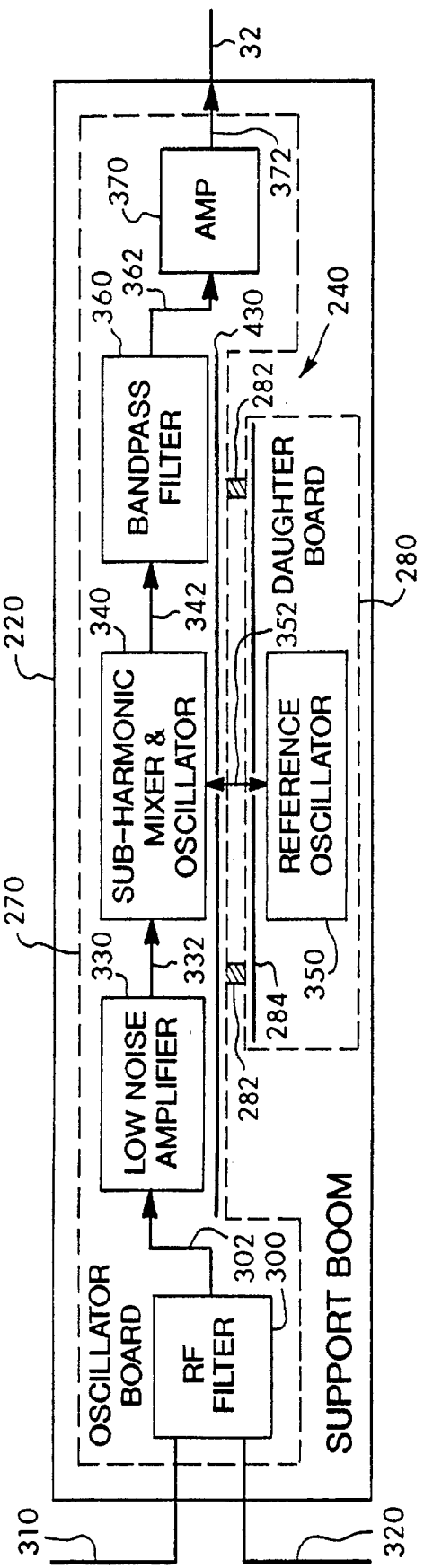
FIG. 3 is a block diagram of the electronic components of the present invention.

In FIG. 3, the block diagram circuit details of the integrated down converter 240 are shown. The oscillator board 270 and the daughter board 280 are located within the support boom 220. As shown in FIG. 2, spacers 282 space the daughter board 280 from the oscillator board 270. The bottom ground plane 430 of the first printed circuit board (i.e., oscillator board) 270 faces the bottom ground plane 284 of the second printed circuit board (i.e., daughter board) 280. The spacing (i.e., caused by spacers 282) and the orientation of the daughter board (i.e., bottom ground planes 430 and 284 facing each other) isolate the electronics on the first and second boards and minimize any signal interferences between the operation of the two boards.

On the oscillator board 270 is located an RF filter 300 that is directly connected to the feed elements 310 and 320. The RF filter 300 is connected over line 302 to a low noise amplifier 330 which in turn is connected to the sub-harmonic mixer and oscillator 340. The RF filter 300 and the amplifier 330 constitute input circuitry. The sub-harmonic mixer and oscillator 340 receives an error correction signal from the reference oscillator 350 over line 352. The sub-harmonic mixer and oscillator 340 is interconnected to a bandpass filter 360 over lines 342. The bandpass filter 360 is connected to an amplifier 370 over lines 362. The bandpass filter 360 and the amplifier 370 constitute output circuitry. The amplifier 370 is connected to the coax 32. The down converter circuitry utilized to implement the components of FIG. 3 is well known and the details of this circuitry are not necessary for the teachings of the present invention.

From an operational point of view, the RF filter 300 is directly coupled to the feed elements 310 and 320. The details of this direct interconnection will be discussed subsequently. The RF filter provides front end selectivity. The front end selectivity is gained by a combination transmission line and lump component high pass filter. As will be discussed subsequently, the filter is shielded on the top, bottom, and sides to eliminate the potential for IF frequencies passing through the cavity defined by the support boom 220 and entering the active circuits. The RF filter 300 provides bandpass filtering for incoming signals from feed elements 310 and 320 above 2480 MHz. The filter 300 could be the aforesaid high pass design or could be designed as a bandpass filter in the range of about 2480 to 2700 MHz.

Figure 5:
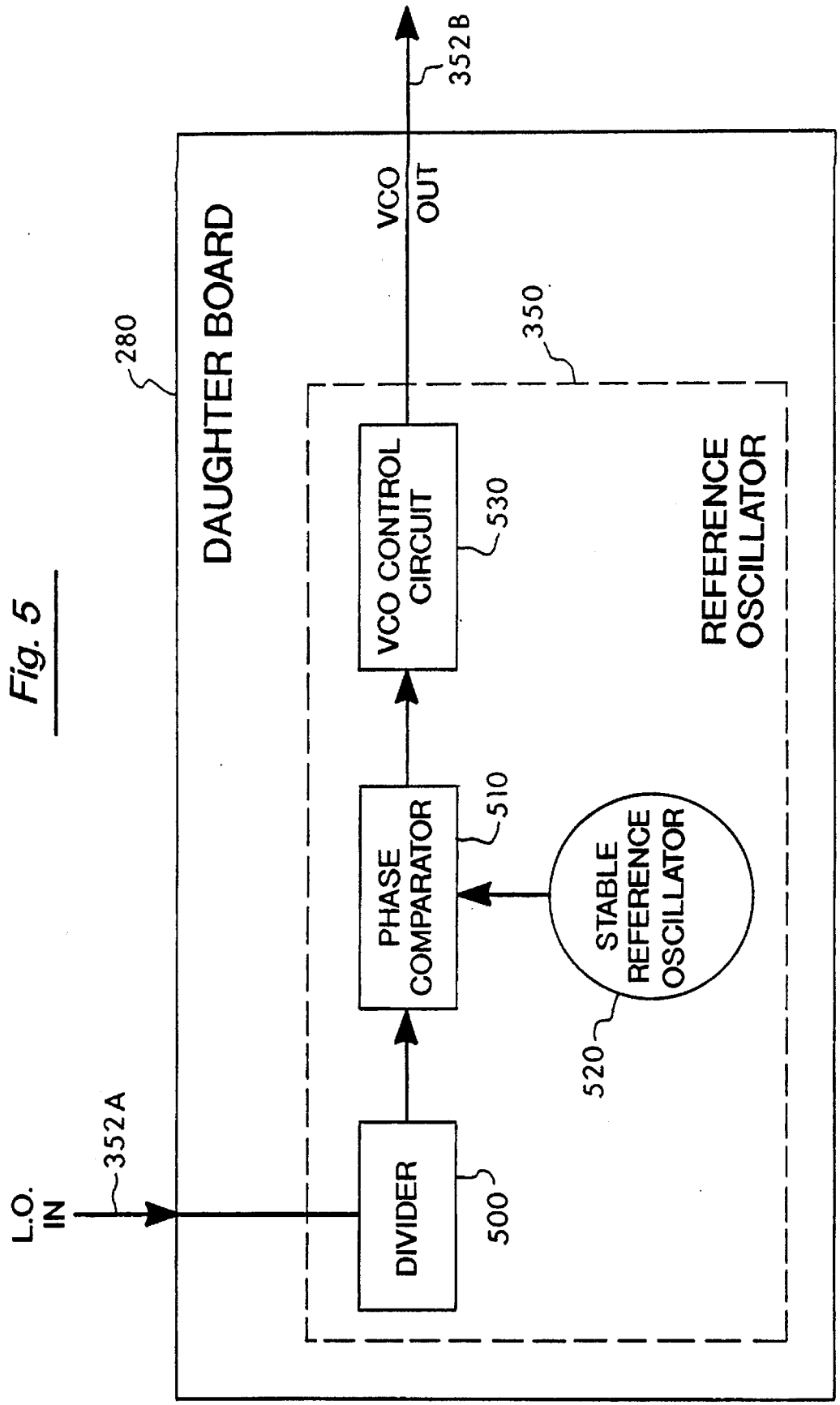
FIG. 5 sets forth the electronic circuitry for the daughter board of the present invention.

The low noise amplifier 330 provides sufficient gain to establish overall noise figure. The output of the low noise amplifier 330 is delivered over lines 332 to the sub-harmonic mixer and oscillator 340. It is to be understood that any suitable mixer design such as an active or single diode design could be utilized. In the preferred embodiment, the oscillator is a single bipolar transistor in a common collector configuration. Frequency stability is achieved by locking the oscillator to a stable reference oscillator 350 that is delivered over line 352 from the daughter board 280, as shown in FIGS. 3 and 5. The reference oscillator 350 utilizes phase lock loop circuitry and is located on the separate daughter board 280 to minimize the potential for digital noise in the RF circuits 340. In FIG. 5, the daughter board 280 receives the local oscillator signal on line 352A from the sub-harmonic mixer and oscillator 340. This signal is delivered into a divider circuit 500 and is then transferred into the phase comparator 510 for comparison to a reference signal from the stable reference oscillator 520. If any differences are detected, the control circuit. 530 adjusts the voltage control output $V_{CO}$ and delivers it back over line 352B to oscillator 340. Noise and signal interference are minimized by (1) separating the reference oscillator onto a second printed circuit board, (2) spacing the separate printed circuit board from the oscillator board, and (3) orienting the bottom ground plane of the second printed circuit board to face the bottom ground plane of the oscillator board. The spacing 282 and the orientation of ground planes 430 and 284 are illustrated in FIGS. 2 and 3.

Once the RF signal on lines 332 is mixed to the desired output frequency by circuit 340, the output signal is delivered on lines 342 into the bandpass filter 360. The bandpass filter filters the output signal on lines 342 according to customer requirements but usually in the range of 150–288 MHz.

The filtered signals are delivered on lines 362 to the output amplifier 370, which functions to amplify the signals with approximately 18-dB gain.

Finally, the coax 32 is connected directly to the output of the amplifier 370 and delivered as shown in FIG. 1. It is to be expressly understood that a number of different electronic circuits could be utilized as a down converter for MMDS applications and that the present invention is not to be limited to the application of a particular design.

3. Front End Filter Shield

Figure 4:
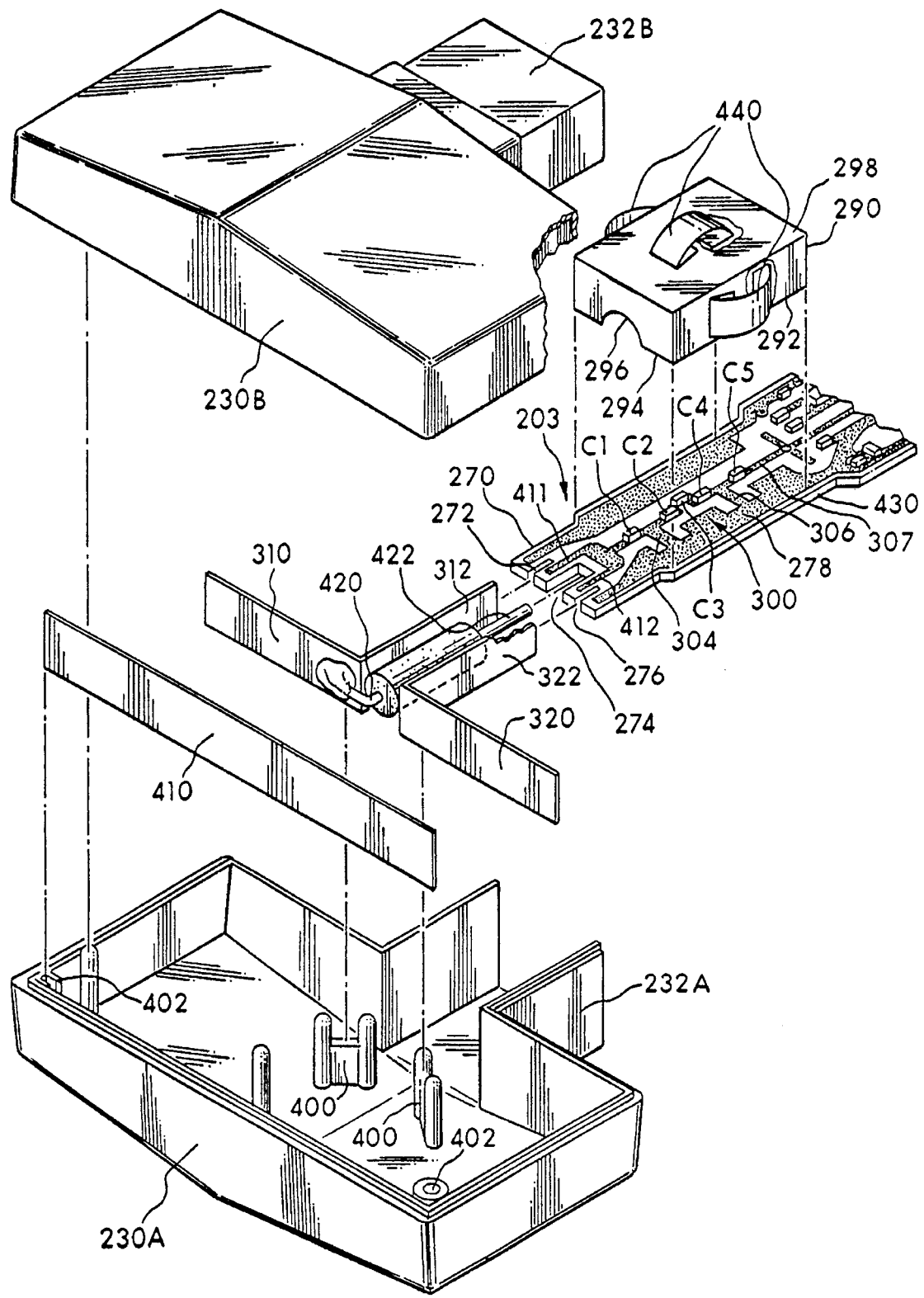
FIG. 4 is an exploded view of the front end of the down converter of the present invention with respect to the drive elements and the housing for the drive elements.

In FIG. 4, the details of the feed housing 230 and the front end filter shield 290 are shown. In FIG. 4, the feed housing 230 consists of a female portion 230A and a male portion 230B. The two portions are designed to fit together to form a weatherproof housing as shown. The driven elements 310 and 320 are held within the housing 230 by pedestals 400. A sub-reflector 410 is held within the housing 230 by slots 402. Also shown in FIG. 4 is the oscillator printed circuit board 270. Printed circuit board 270 at the feed end has three formed slots 272, 274, and 276. Driven element 310 is inserted into slot 272 while driven element 320 is inserted into slot 276. In FIG. 4, connection leg 322 is soldered to top ground plane 278 and bottom ground plane 430 of oscillator board 270. Connection leg 312 of the driven element is soldered to top ground plane 278 and bottom ground plane 430 of oscillator board 270. The balun center conductor 420 has its end 422 soldered 413 to copper pads 411 and 412. It is to be expressly understood that the design of balun 420 could vary and that the teachings of the present invention are not limited to the design illustrated.

As can be observed, the driven elements 310 and 320 are directly soldered to the oscillator board 270 to directly input the RF filter 300. A separate coax is not required. The advantages of this direct connection are (1) the elimination of a weather seal, (2) lower insertion loss, (3) lower cost, and (4) improved impedance matching.

Figure 6:
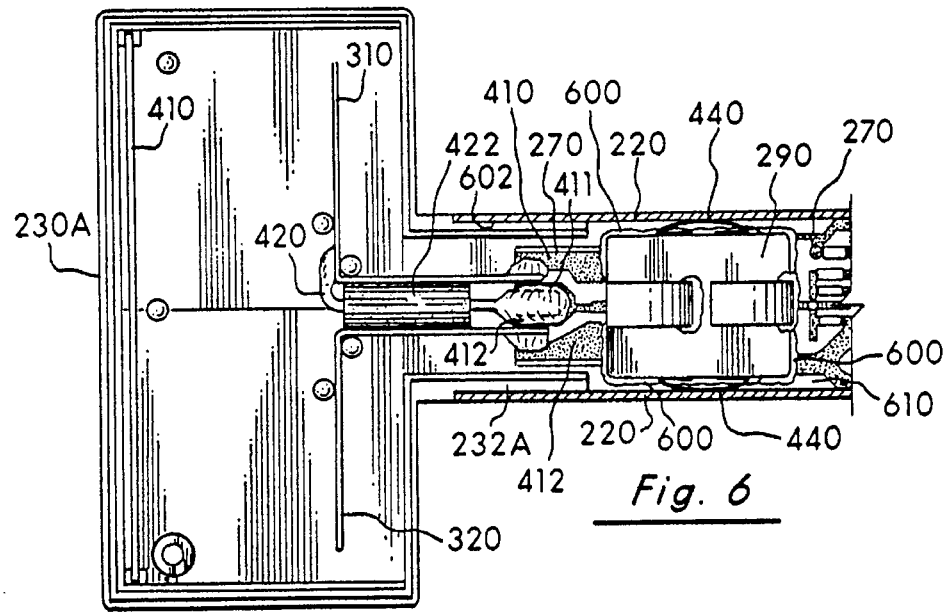
FIG. 6 is a top cutaway planar view of the front end of the down converter of the present invention as interconnected with the drive elements.
Figure 10:
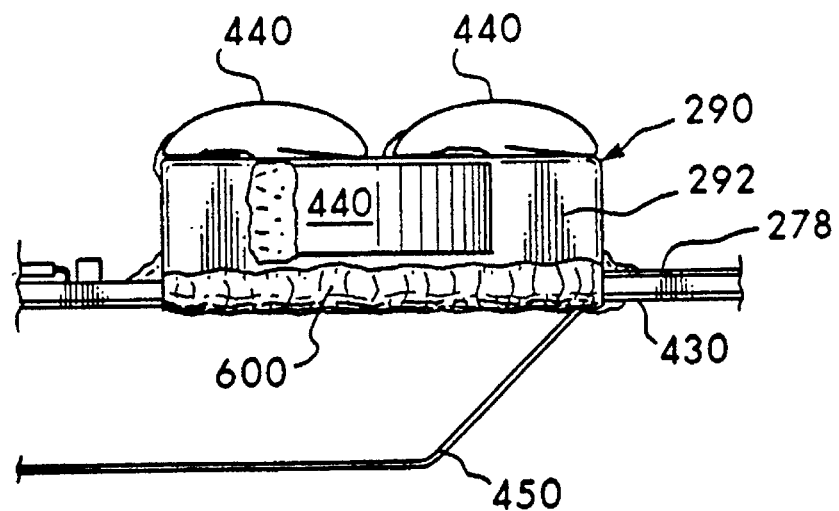
FIG. 10 is a side planar view of the front end filter shield.

As shown in FIGS. 4, 6, and 10, a front end filter shield 290 of solid conductive material (e.g., copper) is designed to be placed over the input RF filter 300. The front end filter shield 290 has the bottoms of its opposing sides 292 and opposing ends 294 soldered 600 to the top ground plane 278 of the oscillator board 270 and to the bottom ground plane 430. Opposing arcuate cutouts 296 are not soldered to the ground plane 278 so as to provide signal pathways. Three ground clips 440 are soldered to the filter shield 290 as shown in FIG. 4 on three sides of the shield 290 (i.e., top 298 and opposing sides 292). The ground clips 440 are designed to firmly abut the inside sidewalls 602 of the support boom 220. As shown in FIG. 2, a fourth ground shield clip 450 is soldered to the bottom ground plane 430 of oscillator board 270 under the shield 290. The four ground clips firmly position and hold the input end 203 of the oscillator board 270, connected to the driven elements 310 and 320, in place within the support boom 220. The four ground clips also provide electrical contact with the interior sidewalls 602 of the metal support boom.

FIGS. 6 and 10 illustrate the front end filter shield 290 soldered 600 to the ground planes 278 and 430 of the oscillator board 270. The end 503 is also shown fully supported and positioned within the interior 610 of the boom 220 by the ground clips 440 and 450. The four ground clips 440 and 450 firmly electrically contact the grounded metallic boom to provide substantial shielding of the input RF filter 300 and to prevent unwanted signals from propagating into the hollow interior of the boom and into the downstream circuitry of the down converter. For example, the front end filter shield 290 eliminates the potential for out-of-band (including IF) frequencies passing through the cavity of the boom 220 and entering the active circuitry of the down converter. The boom 220 is fully grounded to the shield, which in turn is grounded to the ground planes 278 and 430.

It is to be expressly understood that a number of different configurations for designing the shield 290 of the present invention could be utilized.

4. Coax Bracket

Figure 7:
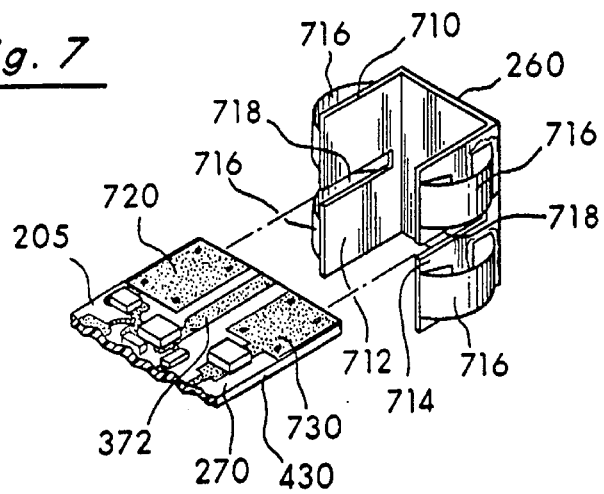
FIG. 7 is a perspective view of the output end of the down converter of the present invention.
Figure 8:
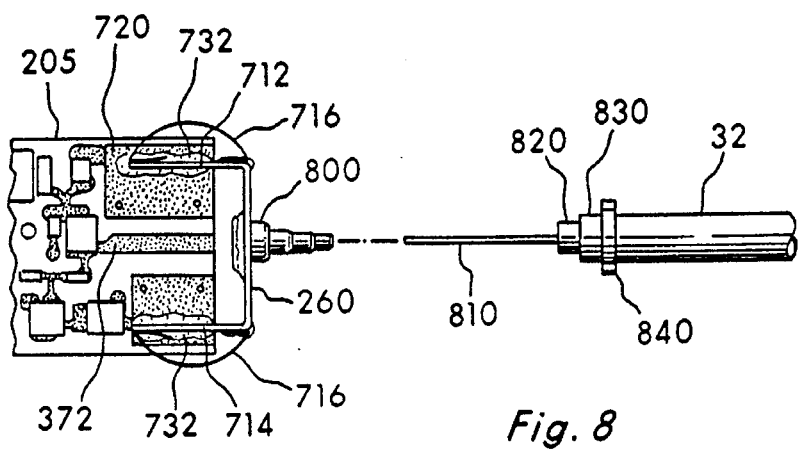
FIG. 8 is a top planar view showing the connection of the coax bracket of the present invention connected to the output end of the down converter of the present invention.
Figure 9:
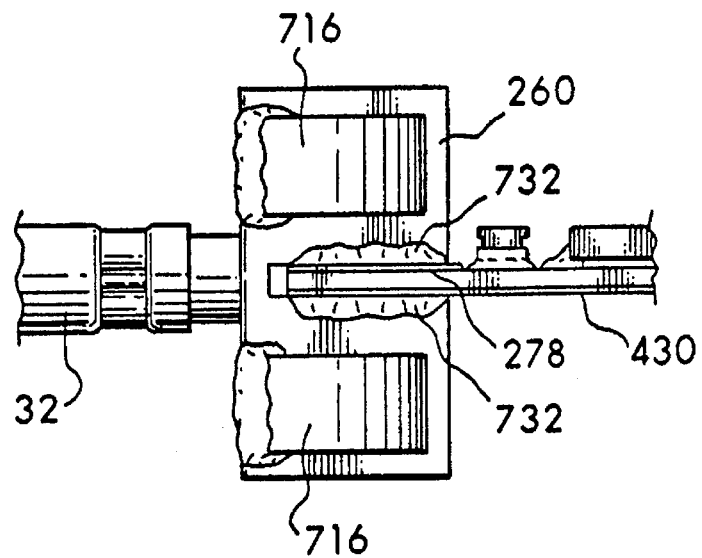
FIG. 9 is a side planar view of the coax ground shield of FIG. 8.

In FIGS. 7–9, the output end 205 of the oscillator board 270 is shown interconnected to a coax bracket 710. The coax bracket 710, formed of solid conductive material (e.g., copper), is designed to be soldered to the output end 205 of the oscillator board 270. The end 205 of the oscillator board has two opposing ground pads 720 and 730 with the output signal lead 372 disposed therebetween. Lead 372 is connected to the output of amplifier 370. The coax bracket 710 has two legs 712 and 714. On the external opposing sides of each leg, 712 and 714, are soldered two ground clips 716. Each leg 712 and 714 has a formed slot 718 that is designed to slip over end 700. As shown in FIG. 9, legs 712 and 714 are soldered 732 on both sides of the legs 712 and 714 to the top ground pads 720 and 730 and to the bottom ground plane 430. In other words, the upper and lower edges of the slots 718 are soldered on both sides 278 and 430 of the ground plane. This provides a solid electrical ground connection.

As shown in FIGS. 8 and 9, an inner barrel 800 is soldered to the coax bracket 710. The coax 32 has its center conductor 810 exposed with approximately ¼ inch of the center insulation 820 exposed. The center conductor 810 is mounted through the inner barrel 800 and the center conductor 810 is soldered to the lead 372. The ground sheath 830 of coax 32 is crimped to the inner barrel 8013. Crimp ring 840 is used to accomplish this. In this fashion, the ground sheath 830 is fully grounded to the coax bracket 710, which in turn is fully grounded to the ground plane of the circuit board to prevent unwanted signals from entering the boom via the coax or the end of the boom nearest the antenna. The ground clips 716 center the end 205 of the oscillator board within the hollow interior of boom 220 in a fashion set forth in FIG. 6. The ground clips 716 also fully ground the end 700 of the board 270 to the internal sides of the support boom 220.

It is clear that the down converter circuitry is fully integrated into the boom. In comparison to standard separate down converters, the housing for the down converter is eliminated as well as the wind load associated therewith. The coax connects directly with the coax shield at a point that is fully grounded.

5. Connection with a Feed on a Printed Circuit Board

In FIGS. 11–15 an alternate embodiment of the present invention is shown for the integrated antenna/down converter. A flat dipole feed 1100 on a printed circuit board interconnects with the printed circuit board of a down converter 1110.

Figure 13:
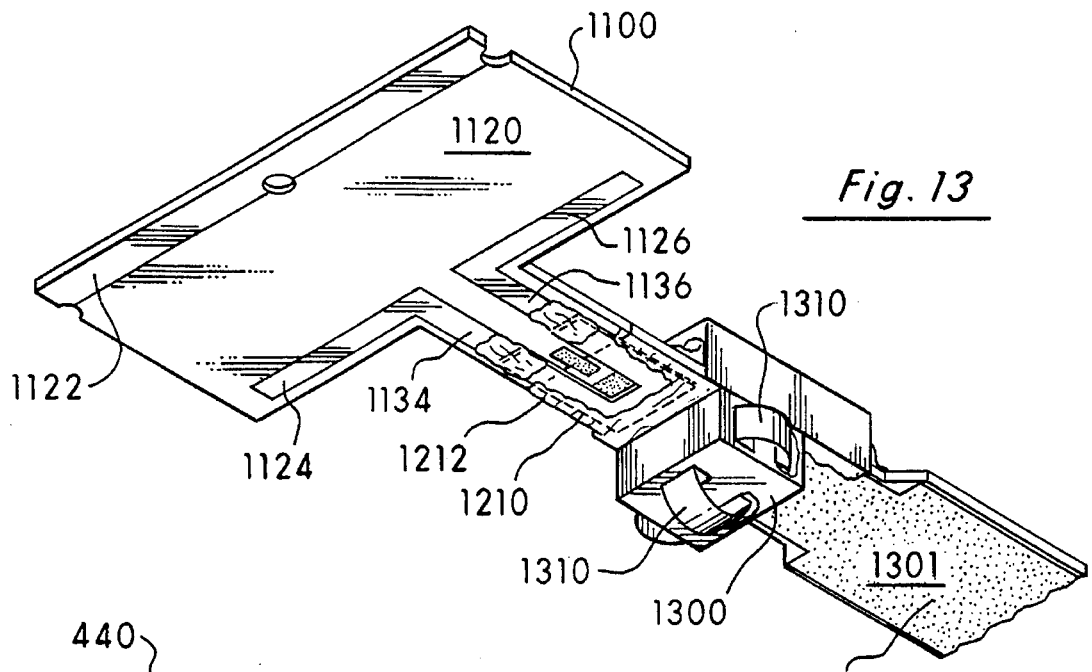
FIG. 13 is a lower perspective view of the embodiment shown in FIG. 11.
Figure 14:
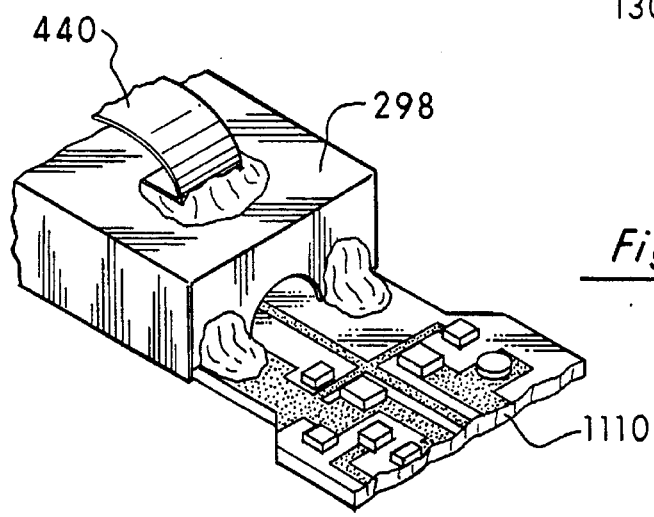
FIG. 14 is a partial perspective view showing the interconnection of the ground shield to the down converter of FIG. 11.
Figure 15:
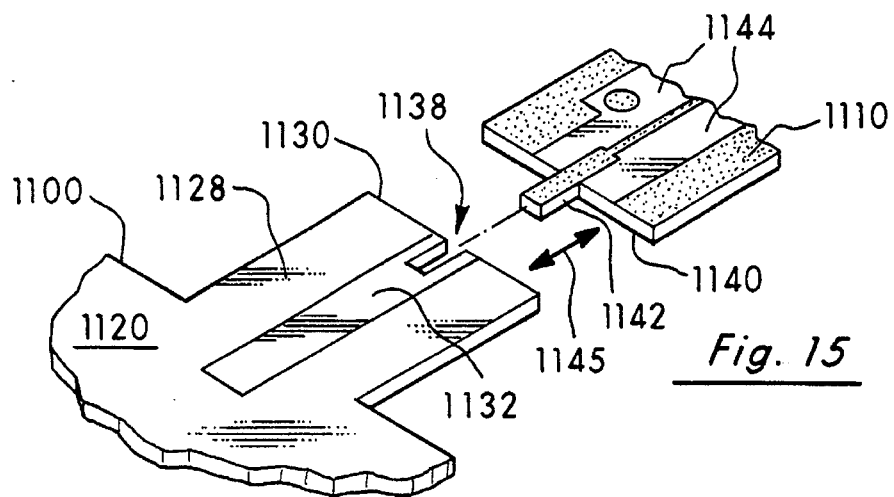
FIG. 15 is a partial perspective and exploded view of the down converter board interconnecting with the feed printed circuit board.

The flat feed 1100 is formed of printed circuit board 1120 having a reflector 1122 formed on both sides of the printed circuit board 1120 as shown in FIGS. 11 and 13. As shown in FIG. 13, one side of the printed circuit board 11211 has the dipole half-elements 1124 and 1126 formed thereon. Dipole half-elements 1124 and 1126 are designed to receive in the desired MMDS/MDS frequency range. The printed circuit board 1120 is formed in a T-shape. The T-shape has a center leg portion 1128 as shown in FIG. 15 that terminates in a flat end 1130 directly opposite the reflectors 1122. The leg 1128 has formed thereon a conductive rectangular plate 1132 on one side and dipole elements 1134 and 1136 on the other side. A rectangular notch 1138 is formed substantially in the center of end 1130. The depth of the formed notch 1138 can be of any suitable depth. The down converter 1110, as shown in FIG. 15, also terminates in a flat end 1140 having a protrusion 1142 extending therefrom. The protrusion 1142, in the preferred embodiment, is rectangular in shape and corresponds in shape and length to slot 1138. As shown by arrow 1145 the down converter board 1110 selectively abuts against printed circuit board 1120 so that the ends 1130 and 1140 join in an abutting relationship as shown in FIG. 11 and so that protrusion 1142 engages slot 1138. Whether the down converter board has the protrusion or the notch (or whether the protrusion or the notch is on the feed board) is a matter of design choice.

With reference to FIG. 12, a top rectangular flat plate 1200 is placed over the engagement of the protrusion 1140 with the slot 1138. The plate 1200 is metal and is designed to be greater in perimeter than the perimeter of engagement between the protrusion 1140 and the notch 1138. The perimeter of the plate is illustrated in FIG. 12 by dotted lines 1202. On down converter board 1110 is deposited conductive material 1144 on both sides of the protrusion 1142. When the plate 1200 is placed over the engagement of the protrusion 1142 with the slot 1138, solder 1204 is applied as shown in FIG. 11 to firmly join metal plate 1200 to region 1132 and regions 1144. The solder fixedly engages, in a permanent fashion, the metal plate 1200 to these regions.

Likewise, a U-shaped conductive plate 1210 (see FIG. 12) is applied, as shown in FIG. 13, to the undersurface. Solder 1212 firmly engages the plate 1210 to the dipole legs 1134 and 1136. Likewise, the U-shaped plate 1210 is soldered to the ground plane 1301 of the down converter board 1110.

The soldering of plates 1200 and 1210 to the flat antenna board 1120 and to the down converter board 1110 provides a rigid mechanical support to both sides of the down converter board 1110 as clearly shown in FIGS. 11 and 13. This provides a rigid structural support to withstand wind and other forms of vibration as well as thermal expansion due to the extreme temperature variations of the environment. What is shown is a sturdy mechanical coupling between the feed printed circuit 1120 and the down converter 1110. Any other suitable design could be used. For example, the U-shaped plate 1210 could comprise two rectangular plates. Or, the plates 1200 and 1210 could have curved ends. The present invention positively teaches the provision of at least one mechanical structural support to provide rigidity to the connection between the down converter and the feed. While the present invention preferably uses two plates, either plate 1200 or plate 1210 could be individually used.

In addition, the embodiment of FIGS. 11–15 also only uses a single grounding clip 440 on the upper housing 298. Opposite shield 298 on the lower side of the down converter board 1110 is a second ground shield 1300 as shown in FIG. 13. Ground shield 1300 has three ground clips 1310 disposed as shown. The two ground shields 298 and 1300 as well as the clips 440 and 1310 firmly hold the down converter and the flat antenna in the support boom 220.

Figure 16:
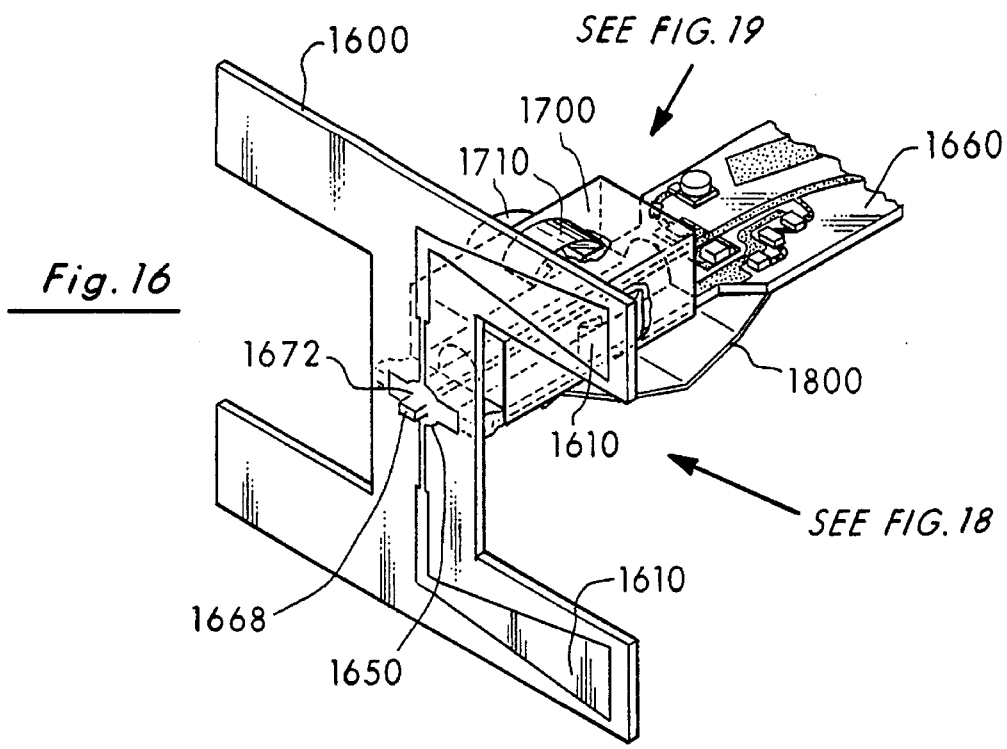
FIG. 16 sets forth a perspective view of the down converter board to the present invention interconnected in a second ,embodiment with a printed circuit feed.
Figure 17:
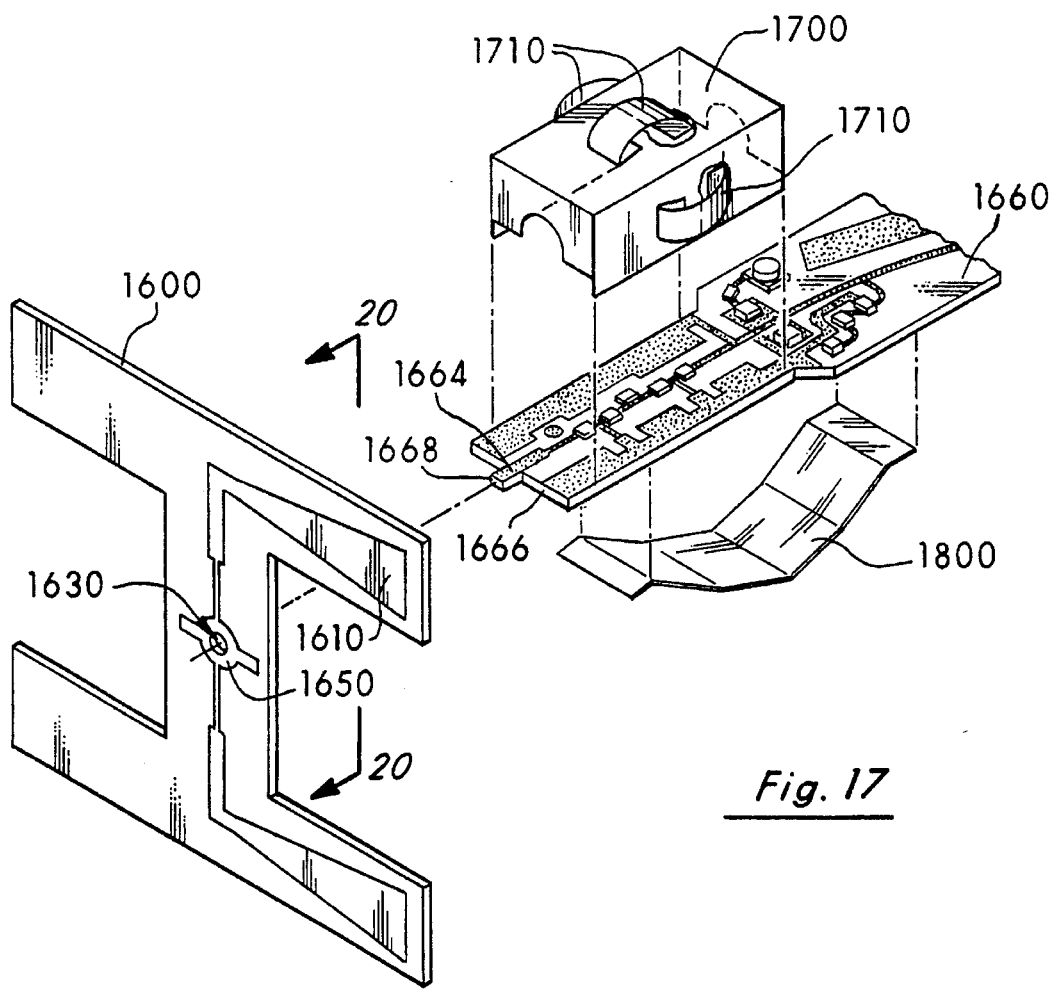
FIG. 17 is an exploded view of the embodiment of FIG. 16.
Figure 18:
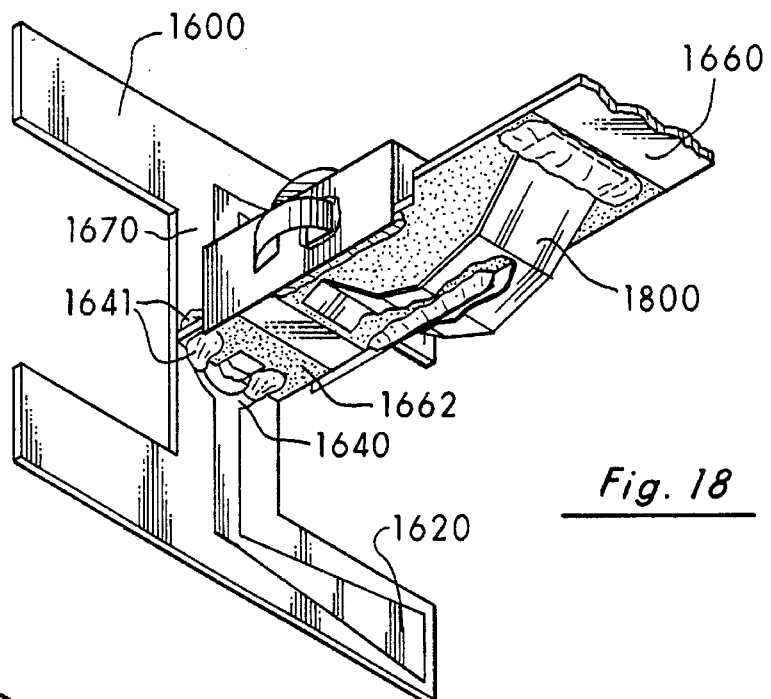
FIG. 18 is a lower perspective view of the embodiment of FIG. 16.
Figure 19:
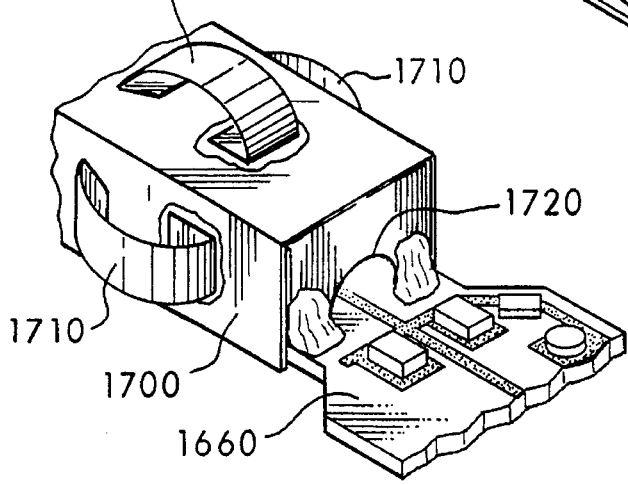
FIG. 19 sets forth the partial perspective view showing the ground shield interconnected to the ground converter board of FIG. 16.
Figure 20:
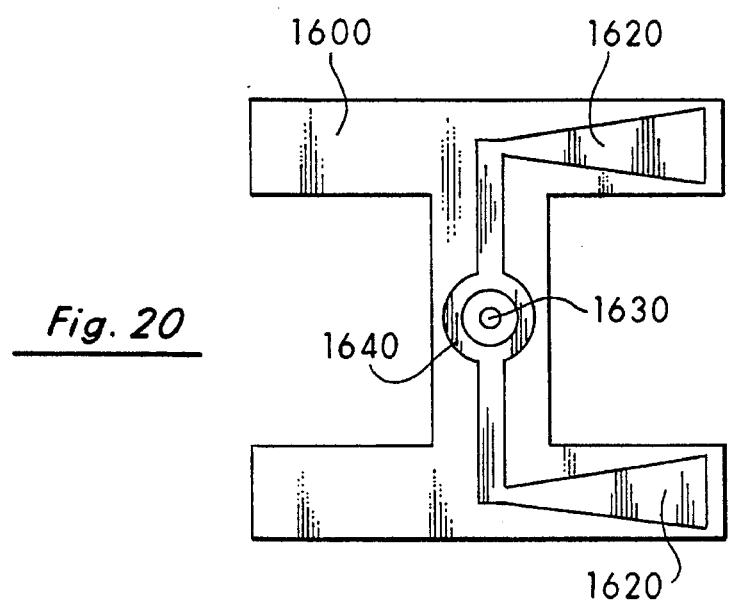
FIG. 20 is a planar view of the printed circuit feed of FIG. 16.

Yet another embodiment of the present invention is shown in FIGS. 16–20. In this embodiment, a dual dipole feed 1600 on a printed circuit board is utilized. The dual dipole feed 1600 is fully disclosed in U.S. Pat. No. 5,229,782. The feed 1600 is formed of printed circuit board generally configured in an H-shape. The design of the dipole elements 1610 and 1620 is not material to the present invention. Suffice it to say that a feed connection point 1630 is provided as shown in FIGS. 17 and 20. As shown in FIG. 20, an outer ring 1640 provides a conductive connection pad to the dipole elements 1620. On the opposite side of the feed 1600 is an inner circular ring 1650 as shown in FIG. 17. For the down converter board 1660, the bottom conductive plane 1662 as shown in FIG. 18 is soldered 1641 to the outer circular ring 1640 of FIG. 20. The conductive path 1664 on the protrusion 1668 of the down converter board 1660 is to be connected to the inner circular ring 1650 as shown in FIG. 17. Again, the end 1666 of the down converter board 1660 is flat but contains protrusion 1668, which carries the conductive path 1664. As shown in FIG. 16, the end 1666 is designed to abut against the flat surface 1670 of the feed 1600 so that the protrusion 1668 passes through the connection point 1630 so that the conductive path 1664 can be soldered 1672 (FIG. 16) to the inner circular ring 1650.

A first ground shield 1700 with clips 1710 are provided. A second ground shield and clip 1800 is used on the opposite side of the board 1660. As shown in FIG. 19, an opening 1720 is provided as discussed hereinfore.

In both embodiments discussed above, the feed printed circuit board is affixed to the printed circuit board carrying the down converter. This affixation provided a mechanical connection wherein the first and second printed circuit boards abut and are affixed into a rigid integrated unitary structure. In FIG. 11, the structure provides a relationship wherein the feed printed circuit board is orthogonal to the down converter board and in FIG. 16, the structure provides a relationship wherein the feed board is in the same plane as the down converter board. The unitary structure fully withstands environmental stresses and is inexpensive in construction.

It is to be expressly understood that the claimed invention is not to be limited to the description of the preferred embodiment but encompasses other modifications and alterations within the scope and spirit of the inventive concept.

We claim:

1. An integrated antenna and down converter apparatus for receiving and down converting microwave signals comprising:

a first printed circuit board having opposing sides and an end, said first printed circuit board having formed thereon:
(a) an antenna formed on one of said opposing sides for receiving said microwave signals, said antenna having an output,
(b) an opening formed in said end of said first printed circuit board, said formed opening located at said output, a down converter having an input, a second printed circuit board having opposing sides and an end, said second printed circuit board carrying said down converter and having formed thereon:
(a) said input of said down converter,
(b) a protrusion extending from said end of said second printed circuit board, said protrusion located at said input, said opening of said first printed circuit board receptive of said protrusion of said end of second printed circuit board for abutting a portion of said second printed circuit board against a portion of said end of first printed circuit board; and means affixing each opposing side of said flint circuit board to the corresponding opposing side of said second printed circuit board for providing a rigid integrated unitary structure for said antenna and said down converter, said providing means further providing an electrical connection between said input and said output.

2. The apparatus of claim 1 wherein said affixing means is solder.

3. The apparatus of claim 1 further comprising a conductive plate, said conductive plate oriented over said input and said output, said affixing means further electrically connecting said conductive plate to said input and said output, said metal plate further providing mechanical structural support between said first printed circuit board and said second printed circuit board so as to withstand environmental stress and vibration.

4. An integrated antenna and down converter apparatus for receiving and down converting microwave signals comprising:

a first printed circuit board having top and bottom sides, said first printed circuit board having:
(a) an antenna printed on at least one of said sides of said first printed circuit board for receiving said microwave signals, said antenna having an output,
(b) first connection means formed through said first printed circuit board, said first connection means located at said output, a down converter having an input, a second printed circuit board having top and bottom sides and a peripheral edge, said second printed circuit board carrying said down converter and having:

(a) said input of said down converter printed on one of said sides of said second printed circuit board,
(b) second connection means formed through said second printed circuit board, said second connection means located at said input, said first connection means of said first printed circuit board engaging said second connection means of said second printed circuit board for abutting a portion of said second printed circuit board against a portion of said first printed circuit board; and means affixing said first printed circuit board to said second printed circuit board for providing a rigid integrated unitary structure for said antenna and said down converter so as to withstand environmental stress and vibration, said providing means further providing an electrical connection between said input and said output.

5. The apparatus of claim 4 wherein said affixing means affixes said first printed circuit board in an orientation wherein said first printed circuit board is in the same plane as said second printed circuit board.

6. The apparatus of claim 4 further comprising a conductive plate, said conductive plate oriented over said input and said output, said affixing means further electrically connecting said conductive plate to said input and said output, said metal plate further providing mechanical structural support between said first printed circuit board and said second printed circuit board so as to withstand environmental stress and vibration.

7. An integrated feed and down converter apparatus for receiving and down converting microwave signals comprising:

a first printed circuit board, said first printed circuit board having:
(a) a feed printed on said first printed circuit board for receiving said microwave signals, said feed having an output,
(b) first connection means formed in said first printed circuit board, said first connection means located at said output, a second printed circuit board, said second printed circuit board carrying said down converter and having:
(a) an input of said down converter printed on said second printed circuit board,
(b) second connection means formed in said second printed circuit board, said second connection means located at said input, said first connection means of said first printed circuit board engaging said second connection means of said second printed circuit board for abutting a portion of said second printed circuit board against a portion of said first printed circuit board; and means for affixing said first printed circuit board to said second printed circuit board in an orthogonal relationship to said second printed circuit board so as to provide a rigid integrated unitary structure for said feed and said down converter so as to withstand environmental stress and vibration, said affixing means further providing an electrical connection between said input and said output.

* * * * *